United States Patent [19]

Okawa et al.

[11] Patent Number: 5,860,202
[45] Date of Patent: Jan. 19, 1999

[54] METHOD FOR PRODUCING A LAYERED PIEZOELECTRIC ELEMENT

[75] Inventors: Yasuo Okawa, Nagoya; Yasuji Chikaoka, Ama-gun; Atsuo Sakaida, Gifu; Yoshihumi Suzuki, Ena; Yoshiyuki Ikezaki, Nagoya, all of Japan

[73] Assignee: Brother Kogyo Kabushiki Kaisha, Nagoya, Japan

[21] Appl. No.: 628,778

[22] Filed: Apr. 5, 1996

[30] Foreign Application Priority Data

Apr. 5, 1995 [JP] Japan .................................. 7-080118

[51] Int. Cl.⁶ ................................................. H04R 17/00
[52] U.S. Cl. ........................... 29/25.35; 29/890.1; 451/36
[58] Field of Search ................ 29/25.35, 890.1; 451/36, 104, 113

[56] References Cited

U.S. PATENT DOCUMENTS 4,523,121  6/1985  Takahashi et al. .

5,140,773  8/1992  Miwa et al. .

FOREIGN PATENT DOCUMENTS

| 0 402 171 A2 | 12/1990 | European Pat. Off. . |
| 0 443 628 A2 | 8/1991 | European Pat. Off. . |
| 0 630 748 A2 | 12/1994 | European Pat. Off. . |
| A-6-79871 | 3/1994 | Japan . |

*Primary Examiner*—Rinaldi I. Rada
*Assistant Examiner*—Kevin G. Vereene
*Attorney, Agent, or Firm*—Oliff & Berridge PLC

[57] ABSTRACT

In a method of manufacturing a layered piezoelectric element 38 constructed from alternately stacked piezoelectric ceramic layers 40 and internal electrode layers 42, 44 and having a plurality of fine actuator portions 46, wherein the layered piezoelectric element 38 deforming the actuator portions 46 in the direction in which they are stacked, slit-shaped holes 52 are formed using ultrasonic wave abrasive particle machining after sintering the stacked body of green sheets 50, 51. The holes 52 are formed as through holes in the layered piezoelectric element 38. The actuator portions 46 are formed so as to be connected by non-through-hole portions 48 at both ends.

23 Claims, 9 Drawing Sheets

METHOD FOR PRODUCING A LAYERED PIEZOELECTRIC ELEMENT

BACKGROUND OF THE INVENTION

1. Field of the Invention

The present invention relates to a method for producing a layered piezoelectric element provided in an ink jet print head which ejects ink droplets to produce diagrams or characters by dots on a print medium.

2. Description of the Related Art

Piezoelectric elements for generating a displacement upon application of a voltage can obtain a large displacement amount when provided in a layered form with piezoelectric material and internal electrodes provided in alternation.

Japanese Patent Application (Kokai) No. HEI-6-79871 discloses a configuration typical for an ink jet print head. As shown in FIG. 1, vertically-displacing pillar-shaped piezoelectric ceramic elements 81 serving as layered actuators are formed from a block-shaped sintered body into which elongated grooves have been opened with a slicer or other instrument. The piezoelectric ceramic elements 81 are configured from stacks of thin piezoelectric element sheets alternating with thin internal electrodes. This configuration allows low voltage drive of the piezoelectric ceramic elements 81. The internal electrodes are exposed in alternation at opposing side surfaces of the piezoelectric ceramic elements 81. The internal electrodes are connected, by wire bonding or by other means, to a drive power source for supplying a voltage for driving the piezoelectric ceramic elements 81.

An elastic thin plate 82 is adhered to the tip ends of the pillar-shaped piezoelectric ceramic elements 81. Further, a nozzle plate 84 made from resin and formed with ink channels 83 and nozzles 83a is adhered to the thin plate 82 so that tip ends of the piezoelectric ceramic elements 81 are positioned over corresponding ink channels 83. Application of a voltage to the piezoelectric ceramic elements 81 produces displacement which deforms the thin plate 82 and ejects ink in the ink channel 83 from the nozzles 83a. Dot-pattern characters and other images can therefore be printed.

However, the pillar-shaped piezoelectric ceramic elements 81 of the ink jet print head shown in FIG. 1 are easily placed under a stress while slicing the narrow grooves that separate them. Therefore, the pillar-shaped piezoelectric ceramic elements 81 can easily snap or break so that production yield of the ink jet print head is low.

Also, the ink jet print head is unreliable because the pillar-shaped piezoelectric ceramic elements 81 can easily break when driven.

Also, only straight grooves can be formed using a slicer, which places limits to the shapes in which the pillar-shaped piezoelectric ceramic elements 81 can be formed.

Also, a slicer can only form one groove at a time. Therefore, forming a large number of pillar-shaped piezoelectric ceramic elements 81 is time consuming and troublesome.

SUMMARY OF THE INVENTION

Copending U.S. patent application No. 08/579,159 describes how sheet forming techniques can be employed to form the piezoelectric material into extremely thin films. An example of a method for producing a stacked body similar to the method described in the copending application is as follows. A piezoelectric material made mainly from lead zirconium titanate (PZT) is mixed to a predetermined composition and then calcined at about 900° C. The resultant powder is mixed with additives such as a binder and a plastic agent to form a slurry. The slurry is forced into a gap between a PET film, which has undergone silicon processes to increase its anti-stick properties, and a doctor blade to form a slurry film on the PET film. The resultant slurry film is dried to form an approximately 100 μm thick green sheet. The green sheet is punched to predetermined dimensions and peeled from the PET film. Then, the surface of the green sheet is coated using screen print techniques with a several micron thick layer of palladium paste, which is the material that will form the internal electrodes of the head. Drying forms internal electrode layers. Several tens of these printed green sheets are stacked and pressed into an integral body using a heat press. Afterward, the binder is removed by heating to about 500° C. A stacked body is obtained by sintering for about two hours at 1,200° C.

This copending U.S. patent application describes a method of forming electrodes on the green sheets and then punching or cutting window-shaped slits into the green sheets. Stacking several green sheets together produces a layered piezoelectric element with actuator portions formed by portions separated by the slits.

When the slits are punched in green sheets before stacking the green sheets, each sheet must be punched separately, which is time consuming. Afterward, the sheets have to be accurately aligned, which is difficult to do precisely. After aligning and stacking, the resultant stacked body needs to be sintered. The stacked body will shrink during sintering processes, but not always to the same degree. Therefore, the slits may come out of alignment during the sintering process. This shrinking also makes it difficult to produce a stacked body having slits in a uniform pitch and with all the actuator portions formed to the same width.

It is therefore an objective of the present invention to provide a method for producing in a short production time a reliably strong layered piezoelectric element using precise machining techniques.

To achieve the above-described objectives, the present invention provides a method, of producing a layered piezoelectric element formed with at least two individually actuating portions, comprising the steps of: forming a stacked body where at least one layer of a piezoelectric material and at least two electrode layers of a conductive material are stacked alternatively in a first direction; and forming at least one hole in the stacked body through an ultrasonic wave abrasive particle machining operation, each of the at least one hole extending at least in a part of the stacked body in the first direction so as to divide the stacked body into at least two actuating portions which are individually deformable when electric fields are developed between corresponding areas of the at least two electrode layers.

The hole forming process may include the steps of:

pressing a machining bit against the stacked body, the machining bit having at least one blade of a shape corresponding to a desired shape of the at least one hole; and vibrating the machining bit with an ultrasonic vibration while supplying the machining bit with a slurry in which abrasive particles are suspended in water.

According to another aspect, the present invention provides a method of manufacturing a layered piezoelectric element having at least a pair of internal electrodes with at least a portion divided into a plurality of actuator portions deformable when selectively energized to develop electric fields between the electrodes, the method comprising the steps of: forming a stacked body by pressing together alternately stacked piezoelectric layers of a piezoelectric material and electrode layers of a conductive material; and forming, using ultrasonic wave abrasive particle machining, holes in the stacked body to a depth in a direction in which the layers are stacked to divide the stacked body into actuator portions.

BRIEF DESCRIPTION OF THE DRAWINGS

The above and other objects, features and advantages of the invention will become more apparent from reading the following description of the preferred embodiment taken in connection with the accompanying drawings in which.

DETAILED DESCRIPTION OF THE PREFERRED EMBODIMENT

Figure 1:
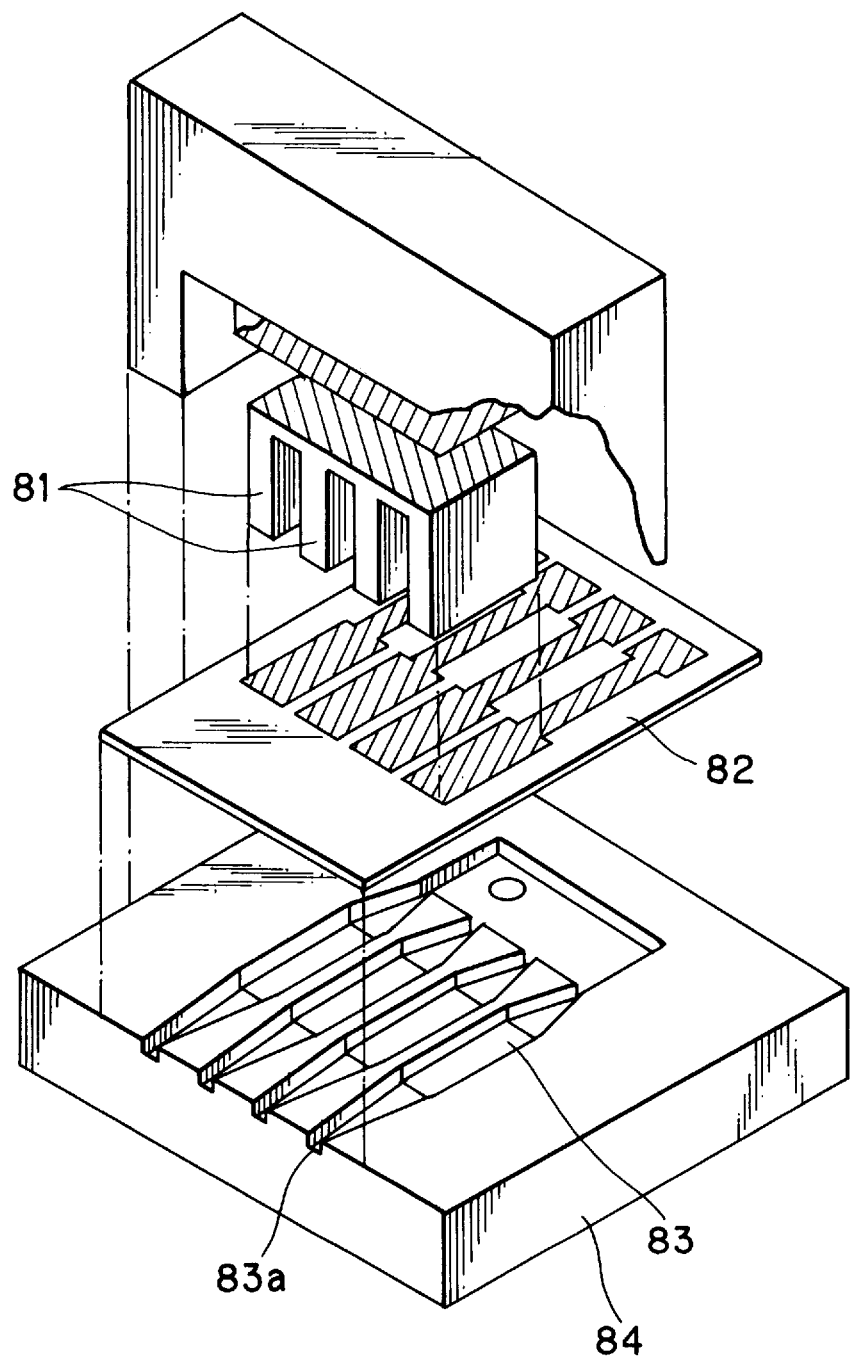
FIG. 1 is a sectional perspective view showing a conventional ink jet print head.

A method of producing a layered piezoelectric element according to a preferred embodiment of the present invention will be described while referring to the accompanying drawings wherein like parts and components are designated by the same reference numerals to avoid duplicating description.

Figure 2:
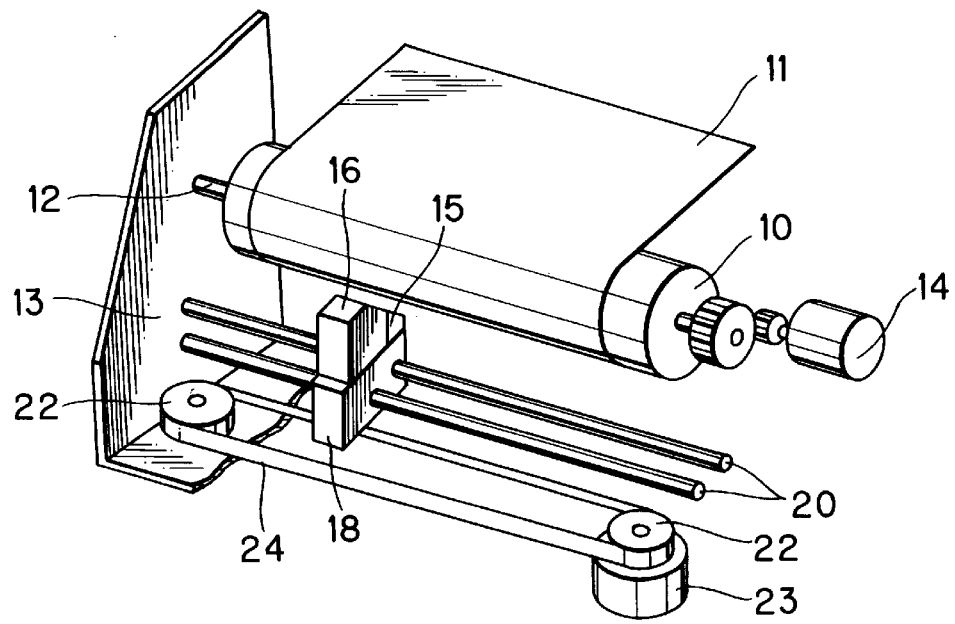
FIG. 2 is a perspective view showing essential portions of an ink jet printer.

First, an ink jet printer, which employs an ink jet print head 15 including the layered piezoelectric element 38 of the present embodiment, will be described while referring to FIG. 2. A platen 10 for feeding a sheet 11 is rotatably mounted to a frame 13 by a shaft 12. A motor 14 is provided for driving the platen 10. Two guide rods 20 are also mounted to the frame 13 in parallel to the axis of the platen 10. A carriage 18 is slidably supported on the two guide rods 20. The ink jet print head 15 and an ink supplier 16 are mounted on the carriage 18 so as to face the platen 10. A timing belt 24 wound on a pair of pulleys 22 is fixed to the carriage 18. A motor 23 is provided for rotating one of the pulleys 22. Feed of the timing belt 24 moves the carriage 18 in alignment with the platen 10.

The ink jet print head 15 is comprised of a plurality of arrays 30, each of which will be described below with referring to FIGS. 3 and 4. Each array 30 has an array of three ejection devices 70a, 70b, 70c.

Figure 3:
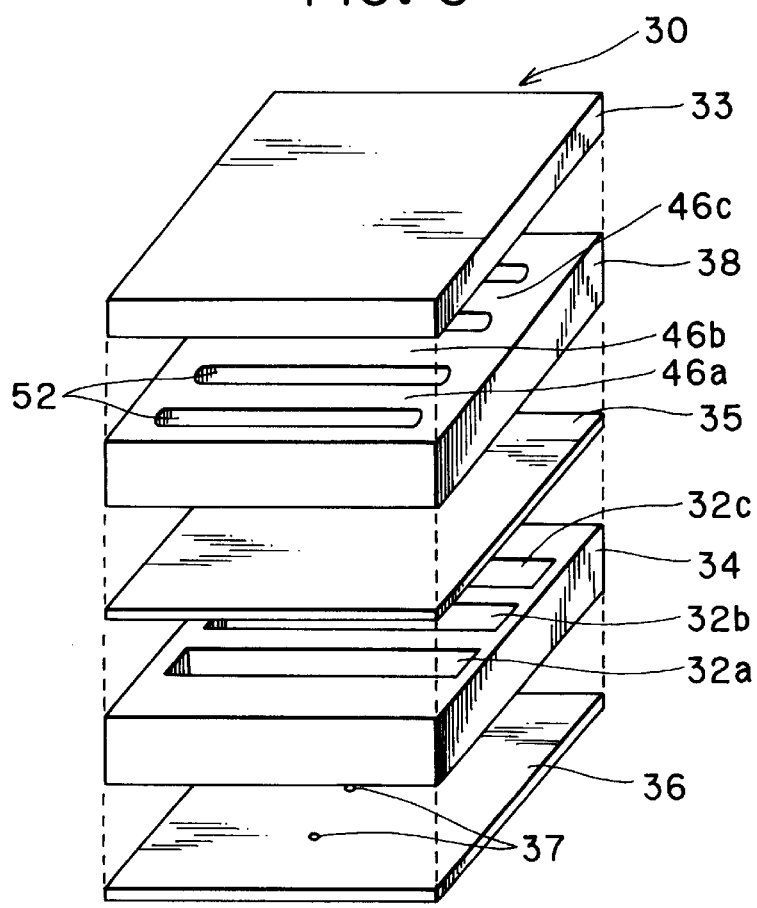
FIG. 3 is an exploded view showing an array in an ink jet print head used in the ink jet printer.

As shown in FIG. 3, the array 30 is constructed from a base plate 33 made from a metal or a ceramic with a high modulus of elasticity, a layered piezoelectric element 38 produced according to the method of the present invention, a thin-film vibration plate 35, a channel main body 34, and an orifice plate 36 formed with orifices 37. These components of the array 30 are attached together in the configuration shown in FIG. 3. That is, the base plate 33 is secured on one side of the layered piezoelectric element 38 and the thin-film vibration plate 35 is disposed to the other side of the layered piezoelectric element 38. The layered piezoelectric element 38 is attached, via the thin-film vibration plate 35, to one side of the channel main body 34 and the orifice plate 36 is attached to the other side of the channel main body 34. The channel main body 34 and the orifice plate 36 are formed by injection molding of a resin material.

The layered piezoelectric element 38 has formed therein a plurality of slit-shaped elongated holes 52, formed in a manner to be described later, defining therebetween actuator portions 46a, 46b, and 46c. The channel main body 34 has formed therein ink channels 32a, 32b, and 32c extending in parallel with and at positions corresponding to the actuator portions 46a, 46b, and 46c. In the present embodiment, the ink channels 32a, 32b, and 32c are formed longer in the lengthwise direction and wider in the widthwise direction than corresponding actuator portions 46a, 46b, and 46c of the layered piezoelectric element 38.

Figure 4:
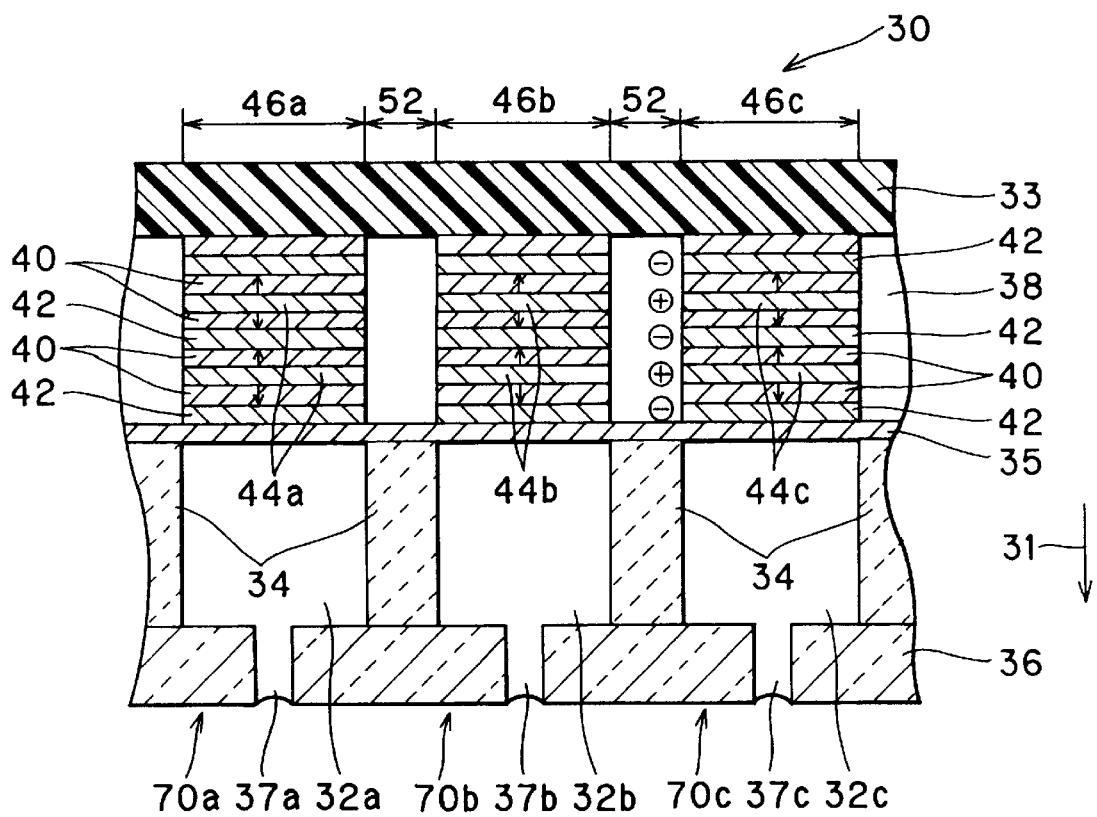
FIG. 4 is a sectional view of the array.

As can be seen in FIG. 4, the array 30 of the present embodiment includes three ejection devices 70a, 70b, 70c, which include the actuator portions 46a, 46b, and 46c and the ink channels 32a, 32b, and 32c respectively. In other words, the actuator portions 46a, 46b, and 46c of the layered piezoelectric element 38 are positioned at cavities formed by the ink channels 32a, 32b, and 32c (which extend perpendicular to the sheet surface of FIG. 4) so that the layered piezoelectric element 38 serves as a piezoelectric actuator for the three ejection devices 70a, 70b, and 70c.

The layered piezoelectric element 38 is a multi-layered body including: piezoelectric ceramic layers 40 having piezoelectric properties; internal negative electrode layers 42 spanning all channels; and internal positive electrode layers 44a, 44b, and 44c. The piezoelectric ceramic layers 40 are composed of a lead zirconium titanate (PZT) ceramic material with ferroelectric properties. As indicated by arrows at the actuator portions 46a, 46b, and 46c in FIG. 4, the piezoelectric ceramic layers 40 are polarized in the direction in which they are layered. The internal negative electrode layers 42 and internal positive electrode layers 44a, 44b, and 44c are composed of a silver-palladium (Ag-Pd) metal material.

Figure 5:
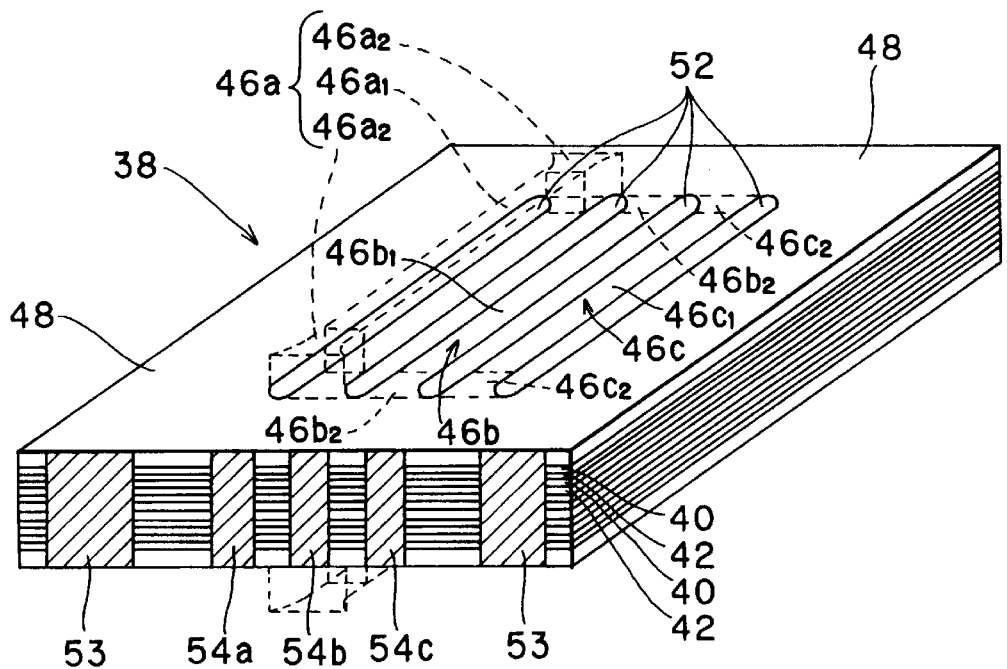
FIG. 5 is a perspective view showing a layered piezoelectric element produced using the method of the present invention.

As can be seen in FIG. 5, the actuator portions 46a, 46b, and 46c are formed at the central portion of the layered piezoelectric element 38 and are divided by the plurality of elongated holes 52. In addition to the actuator portions 46a, 46b, and 46c, the layered piezoelectric element 38 includes piezoelectric inactive portions 48 at edge portions thereof. The piezoelectric inactive portions 48 connect end portions of the actuator portions 46a, 46b, and 46c together. The internal positive electrode layers 44a, 44b, and 44c are divided by the elongated holes 52 to a one-to-one correspondence with the ink channels 32a, 32b, and 32c. The internal electrode layers 42, and 44a, 44b, and 44c overlap at overlapping regions $46a_1$, $46b_1$, and $46c_1$ (indicated by dotted lines in FIG. 5), that is, at all areas between the elongated holes 52 except the tip ends $46a_2$, $46b_2$, and $46c_2$ (also indicated by dotted lines in FIG. 5) of each actuator portion 46a, 46b, and 46c. On the other hand, internal electrode layers 42, and 44a, 44b, and 44c do not overlap at the piezoelectric inactive portions 48 nor at non-overlapping regions $46a_2$, $46b_2$, and $46c_2$, that is, at the tip ends of each actuator portion 46a, 46b, and 46c.

Negative electrodes 53 for energizing the internal negative electrode layers 42 of each layer and positive electrodes 54a through 54c for energizing corresponding internal positive electrode layers 44a through 44c of each layer are formed to the same side surface of the layered piezoelectric element 38.

The layered-type piezoelectric element 38 having the above-described structure is produced by the following method.

First, a powder of a piezoelectric material, which is primarily PZT, is mixed to a desired composition. Then the powder is calcined at 850° C. Next, a defoaming agent, a minute quantity of a plastic material, and five parts by weight binder are added to the powder. The resultant mixture is dispersed in an organic solvent to produce a slurry. The slurry is formed into green sheet base plates 40 with a predetermined thickness using a doctor blade.

Figure 6:
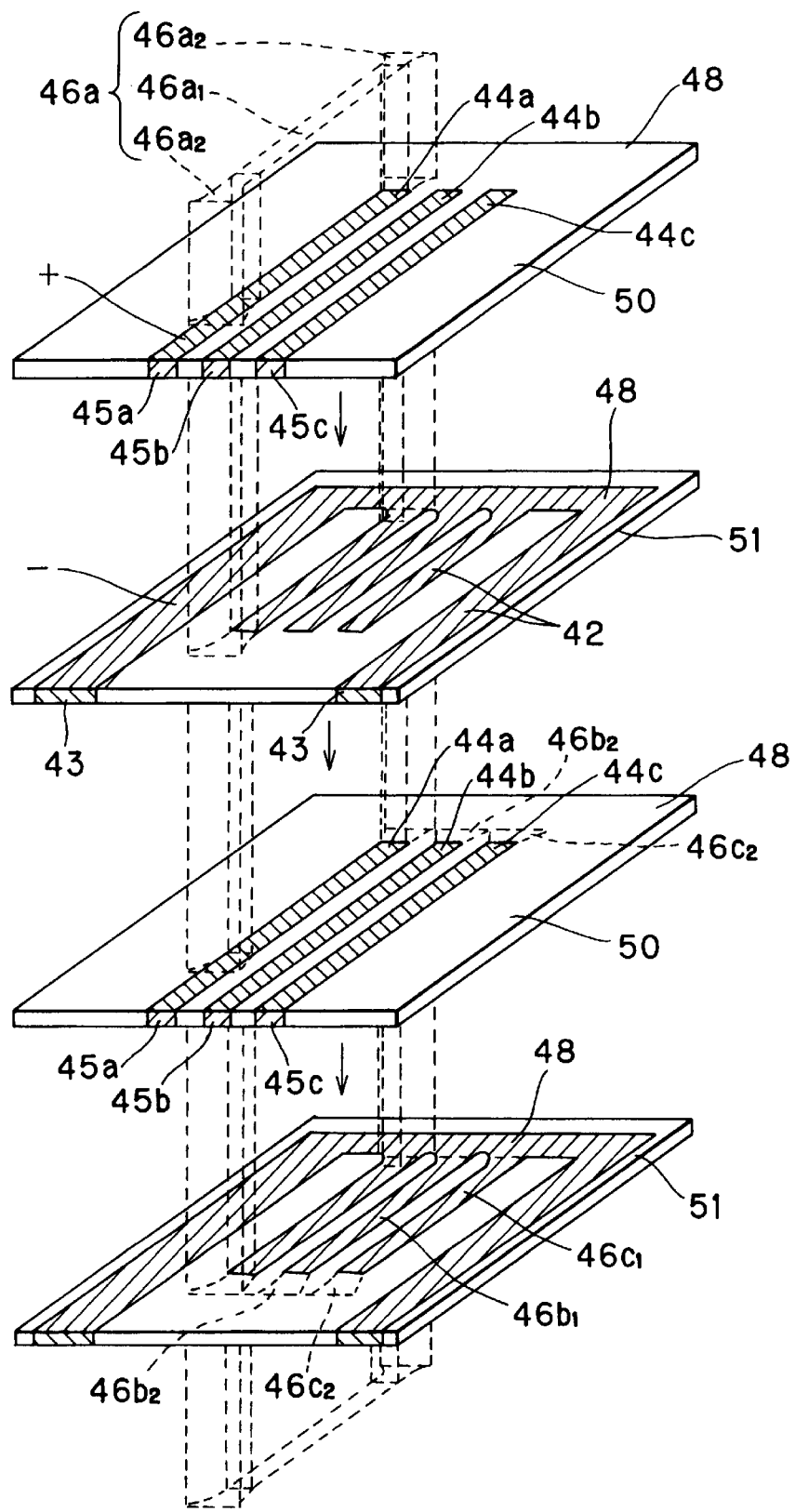
FIG. 6 is a schematic view showing patterns of screen print plates used during the method of the present invention.

The green sheet base plates 40 are then cut to predetermined dimensions. Next, a conductive paste, such as a silver palladium (AgPd) paste, is screen printed on the base plates 40 to form green sheets 50 and 51 with the two different patterns of internal electrodes as shown in FIG. 6. That is, internal positive electrode layers 44a, 44b, and 44c, whose number is a one-to-one correspondence with the number of the ink channels 32a, 32b, and 32c, are first formed by screen printing on the upper surface of each of one group of base plates 40. Then, electrode terminal portions 45a, 45b, and 45c of respective internal positive electrode layers 44a, 44b, and 44c are formed on the same base plates 40 by screen printing to produce a group of green sheets 50. On the upper surface of the remainder of the base plates 40, an internal negative electrode layer 42 with electrode terminal portions 43 is formed traversing across all the ink channels 32a, 32b, and 32c by screen printing to produce green sheets 51. The screen printing operation thus employed in the present embodiment is advantageous in that it is easily possible to form any desired patterns of the electrode layers. The screen printing is capable of easily forming even thin electrode layers.

It should be noted that the internal electrode layers 42, and 44a, 44b, and 44c are formed with their tip end portions drawn slightly back from the ends of corresponding ink channels 32 in the lengthwise direction of the ink channels 32 to insure that, when the green sheets 50, 51 are stacked, the internal positive electrode layers 44 and the internal negative electrode layers 42 overlap each other in the stacked direction only at the overlapping regions $46a_1$, $46b_1$, and $46c_1$. Further, the electrode terminals 43, 45a, 45b, and 45c are formed so as to be exposed on corresponding side edges of the green sheets 50, 51.

Figure 7:
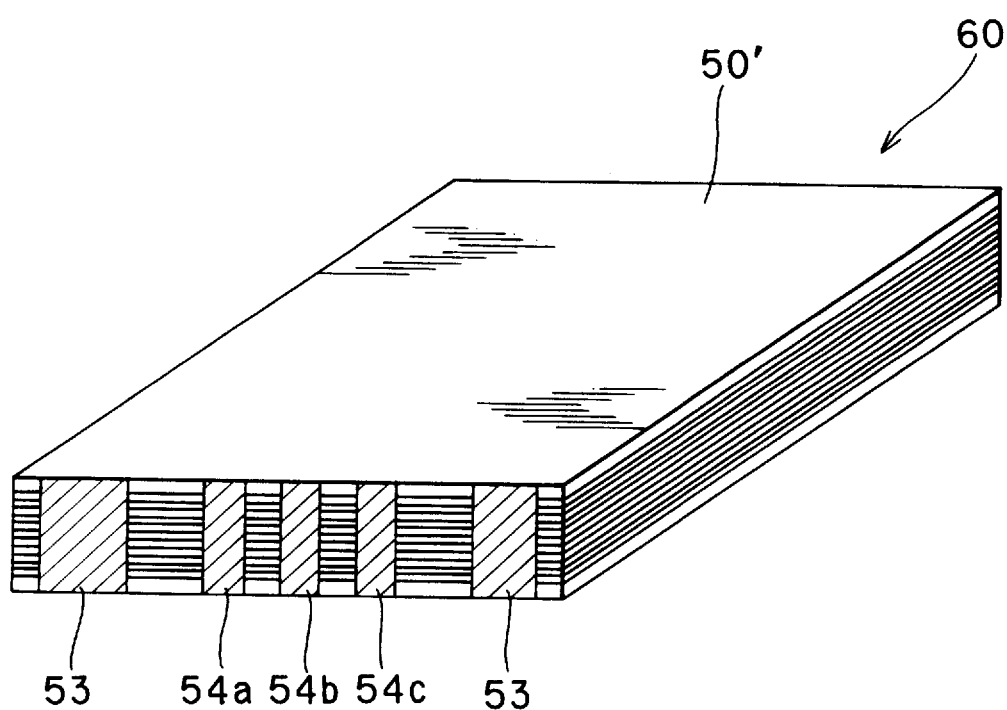
FIG. 7 is a perspective view of a sintered stacked body produced during the method of the present embodiment.

Next, both types of green sheets 50, 51 are stacked alternately to a total of 10 sheets. As shown in FIG. 7, on top is stacked a green sheet 50' with no internal electrode layer on the upper surface of its piezoelectric ceramic layer 40. The sheets are then heat-pressed into an integrated body. After degreasing, sintering is carried out at approximately 1,200° C., resulting in a stacked body 60 made from piezoelectric elements. Thus, the stacked body 60 can be easily obtained.

Outer negative electrodes 53 and outer positive electrodes 54a, 54b, 54c are then attached to locations where the electrode terminal portions 43, 45a, 45b, and 45c are exposed in the thus-formed stacked body 60.

Next, ultrasonic wave abrasive particle machining is performed to divide the stacked body 60 into the plurality of actuator portions 46 shown in FIG. 5. Ultrasonic wave abrasive particle machining is a machining process to remove material from a workpiece by abrasive bombardment and crushing in which a tool is made to vibrate at a ultrasonic oscillation while fine abrasive particles are carried by a liquid between the tool and the workpiece.

Figure 8A:
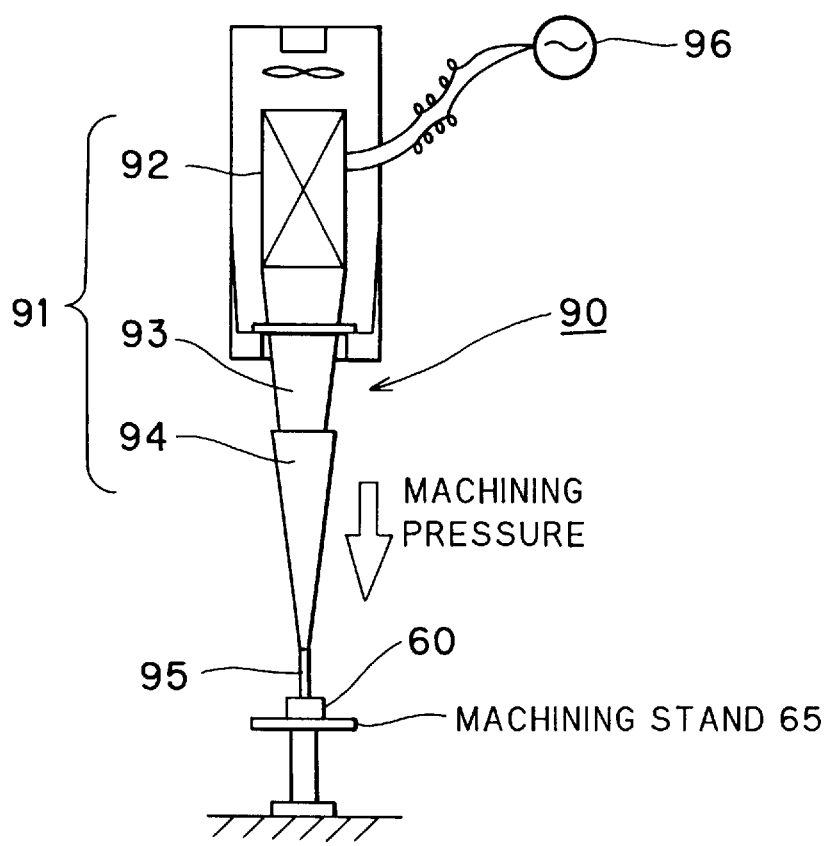
FIG. 8(A) illustrates an ultrasonic wave abrasive machining process using an ultrasonic wave abrasive machine employed in the method of the present invention.

FIG. 8(A) schematically shows an ultrasonic wave abrasive machining apparatus 90 employed for performing the ultrasonic abrasive machining of the present embodiment. The ultrasonic wave abrasive machining apparatus 90 includes a vibrator portion 91, a pressurizing portion 97 shown in FIG. 8(B), an oscillator 96, and an abrasive particle circulation system 98 also shown in FIG. 8(B). The vibrator portion 91 includes a vibrator 92, a cone 93, and a horn 94 connected in this order. The vibrator 92 is for vibrating according to high-frequency power supplied from the oscillator 96 to generate an ultrasonic oscillation. The cone 93 is for magnifying the amplitude of the vibration supplied from the vibrator 92. An upper end surface of the cone 93 is connected with the vibrator 92. The cone 93 has a solid shape with its cross-section gradually reducing from its upper end surface toward its lower end surface. With this structure, the cone 93 can magnify the amplitude of the vibration. The horn 94 is for further magnifying the vibration supplied from the cone 93. An upper surface of the horn 94 is connected with the lower end surface of the cone 93. A cross-section of the horn 94 also gradually reduces from its upper end surface toward its lower tip end. The horn 94 can therefore further magnify the vibration supplied from the cone 93. A machining bit 95 is connected to the lower tip end of the horn 94.

The machining bit 95 is shaped corresponding to machining to be performed. That is, the machining bit 95 is provided with several blades in a pitch and with a blade width adjusted to enable forming slits with predetermined dimensions. The number of the blades equals to the number of slits desired to be formed on the workpiece. In this example, the machining bit 95 has four thin blades for forming the four thin elongated holes 52. The four blades are aligned at a predetermined pitch corresponding to the pitch desired for the actuator portions 46. The blade widths of these blades equal to the widths of the holes 52 desired to be formed.

A workpiece to be machined, i.e., the sintered stacked body 60 in this embodiment, is placed on a machining stand 65 in confrontation with the machining bit 95.

Figure 8C:
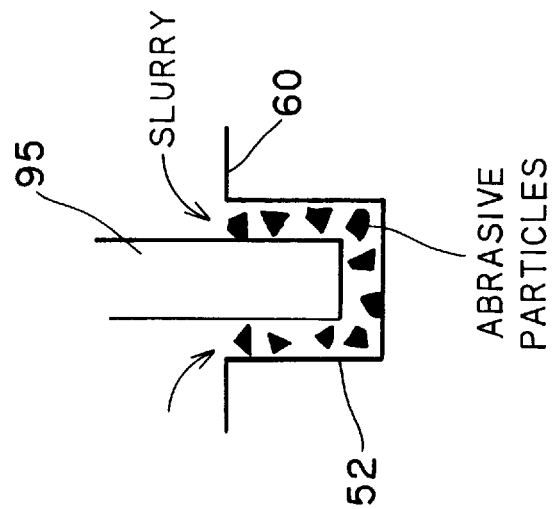
FIG. 8(C) illustrates how the abrasive particles grind the sintered stacked body through the ultrasonic wave abrasive machining process.
Figure 8B:
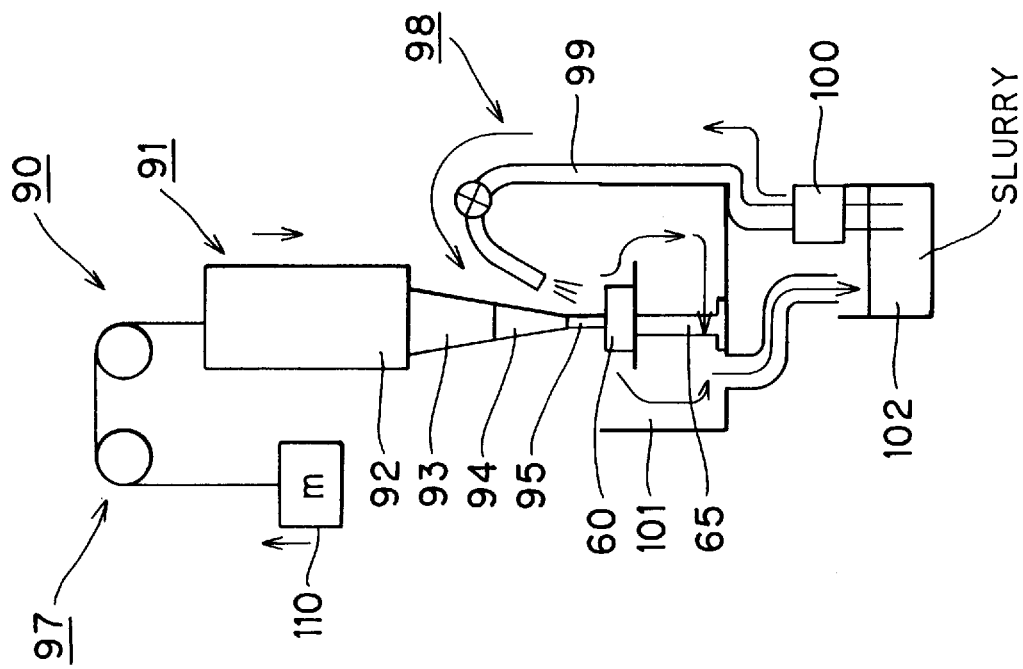
FIG. 8(B) shows details of a pressurizing portion and an abrasive particle circulation system employed in the ultrasonic wave abrasive machine of FIG. 8(A)

As shown in FIG. 8(B), the pressurizing portion 97 is for applying a desired amount of pressure to the machining bit 95 against the workpiece, i.e., the stacked body 60. The pressurizing portion includes a weight 110 connected to the vibrator portion 91. Assume now that the vibrator portion 91 has a total weight M and the weight 110 has a weight m, the pressurizing portion 97 applies a machining pressure of M m to the machining bit 95. Through changing the weight 110, the pressurizing portion 91 can apply to the machining bit 95 a machining pressure suited to the workpiece 60 to be machined.

Or otherwise, the pressurizing portion 97 may be constructed from a transfer system for transferring at a desired velocity the vibrator portion 91 toward the workpiece 60.

As also shown in FIG. 8(B), the abrasive particle circulation system 98 is for continuously supplying a slurry of abrasive particles toward the machining bit 95. In the slurry, silicon carbide (SiC) abrasive particles are suspended in water. The abrasive particles have a particle diameter of about equal to or lower than 50 microns. Preferably, the abrasive particles have a particle diameter of about 10 microns. During the ultrasonic wave abrasive particle machining process, the abrasive particle circulation system 98 continuously supplies the slurry around the bit 95 as shown in FIG. 8(C).

The abrasive particle circulation system 98 includes: a tank 101 in which the machining stand 65 is placed; a slurry tank 102 storing a slurry of the abrasive particles; a pump 100 for drawing the slurry from the tank 102; and a hose 99 for supplying the slurry around the machining bit 95. A bottom of the tank 101 is fluidly communicated with the tank 102 so that the slurry is circulated.

With the above-described apparatus 90, the ultrasonic wave abrasive machining process are attained as described below in greater detail.

First, the horn 94 is attached to the ultrasonic wave machining apparatus 90. The horn 94 is connected with a machining bit 95 corresponding to the desired shapes and arrangements of the holes 52. Then, the machining bit 95 is located on the sintered stacked body 60 placed on the machining stand 65. Then, the blades on the machining bit 95 are aligned with the portions of the stacked body 60 that are desired to be opened to form the elongated holes 52. Areas between the blades on the machining bit 95 are aligned with the portions of the stacked body 60 that are formed with the internal electrode layers 42 and 44 and that are desired to remain unprocessed during the ultrasonic abrasive machining to become the actuator portions 46a through 46c.

Next, the pressurizing portion 97 is adjusted so that a load of several hundred grams is applied to the horn 94 against the stacked body 60. While the abrasive particle circulation system 98 continuously supplies the slurry to the machining area, i.e., around the machining bit 95, the vibrator portion 91 is driven at a frequency of about 20 kHz. As a result, as shown in FIG. 8(C), the supplied abrasive particles grind against the stacked body 60 with vibration of the machining bit 95 so that the contour of the machining bit 95 is transferred to the stacked body 60, thereby forming the elongated holes 52 shown in FIG. 5. The thus formed elongated holes 52 divide the stacked body 60 into the three actuator portions 46, which serve as piezoelectric elements capable of independent deformation.

The ultrasonic abrasive particle machining does not require rotation of the bit or a great deal of relative movement between the bit and the workpiece. Ultrasonic abrasive particle machining also has the following characteristics. (1) The machined surfaces of the stacked body 60 are ground using abrasive particles so that the actuator portions 46 can be formed with smooth surfaces and to precise dimensions. (2) Ultrasonic abrasive particle machining allows great freedom in machining of different shapes. Different shapes can be easily formed by merely changing the shape of the bit tip 95. Therefore, actuator portions can be formed in all manner of shapes. By using a bit tip with a plurality of blades as in the present embodiment, a plurality of elongated holes 52 can be machined simultaneously, thereby reducing the number of processes involved with machining. (3) Ultrasonic abrasive particle machining applies no great forces to the workpiece, i.e., the stacked body 60. The ultrasonic abrasive particle machining applies no great bending forces to the stacked body 60. Accordingly, there is no risk of snapping the actuator portions 46 apart. As a result, ultrasonic abrasive particle machining allows high-density, high-precision machining to the limits allowed by the shape of the bit.

It should be noted that the manner of using the ultrasonic abrasive particle machining for forming the holes 52 is not limited to the above-described example. Various process environments of the embodiment should be modified depending on the material of the stacked body 60, the shape to be machined, and desired precision and speed of machining processes.

For example, the same machining can be performed using abrasive particles other than those made from silicon carbide (SiC), such as abrasive particles made from boron nitride, alumina, or a mixture of at least two of silicon carbide (SiC), boron nitride, and alumina. These abrasive particles can be easily handled.

Generally, the abrasive particles used in ultrasonic abrasive particle machining have a particle diameter of about 50 microns. However, when machining a high-density piezoelectric element actuator used in an ink-jet head as in the present embodiment, it is desirable to use abrasive particles with a particle diameter of equal to or lower than about 50 microns to achieve high-precision machining. It is more desirable to use abrasive particles with a particle diameter of about 10 microns.

Also, vibration frequencies of from about 10 to 20 kHz are preferably used. Also, a machining pressure of between 10 to 100 g/mm$^2$ should be applied to the surface of the stack body 60 made from piezoelectric material.

After the elongated holes 52 are formed in the stacked body to divide it into the plurality of actuator portions 46, a well-known polarization process is executed to polarize the stacked body by application of an electric field.

The polarization process can be carried out, for example, by immersing the stacked body 60 into an oil bath (not shown) filled with an electrically insulating oil, such as silicone oil, heated to about 130° C. An electric field of approximately 2.5 kV/mm is then applied between the outer negative electrodes 53 and the outer positive electrodes 54a, 54b, and 54c to polarize the stacked body. If the piezoelectric ceramic layers 40 of the stacked body are sufficiently thin, for example, approximately 50 $\mu$m, they can be easily polarized without providing a special environment such as the oil bath. In this case, a voltage of approximately 30 V is merely applied between the outer negative electrodes 53 and the outer positive electrodes 54a, 54b, and 54c after the ink jet print head 15 has been assembled.

The layered-type piezoelectric element 38 shown in FIG. 5 is thus produced through the above-described method.

In order to produce the array 30, the channel main body 34 is produced through injection molding of a resin material to have three ink channels 32a, 32b, and 32c. Similarly, the orifice plate 36 are produced through injection molding of a resin material to have three orifices 37a, 37b, and 37c. The layered-type piezoelectric element 38, the channel main body 34, and the orifice plate 36 are assembled together with the base plate 33 and the thin-film vibration plate 35 into a single array 30 as shown in FIG. 3.

Figure 9:
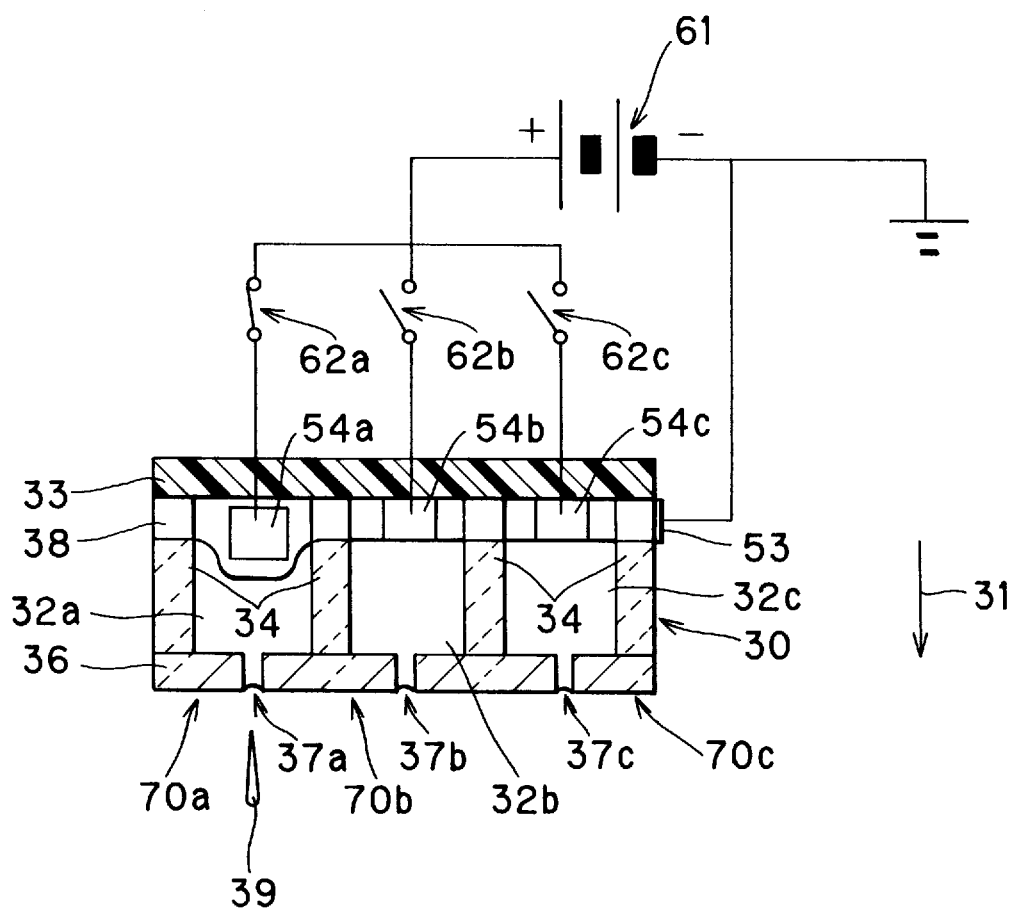
FIG. 9 is a schematic view showing electric circuits provided for driving the array.

Electric circuits provided to the array 30 are shown in FIG. 9.

The outer positive electrodes 54a, 54b, and 54c of the layered-type piezoelectric element 38 are connected to the positive electrode of a drive power source 61 through openable and closable switches 62a, 62b, 62c. The outer negative electrodes 53 of the layered-type piezoelectric element 38 and the negative electrode of the drive power source 61 are grounded. A controller (not shown) opens and closes the switches 62a, 62b, and 62c to selectively apply a driving voltage from the drive power source 61 between the internal negative electrode layers 42 and the internal positive electrode layers 44 located on a selected one of the actuator portions 46a, 46b, or 46c.

In order to produce the print head 15, a plurality of arrays 30 are produced in the same manner as described above, and are assembled together.

Next, the operation of the ink jet print head 15 having the above-described configuration will be described. For convenience of explanation, it will be assumed that the array 30 according to the present embodiment is provided with three ink channels.

In accordance with predetermined print data, the controller closes, for example, the switch 62a so that a voltage is applied between the internal negative electrode layers 42 and internal positive electrode layers 44a of the actuator portion 46a, resulting in a bias electric field developing in the piezoelectric ceramic layers 40 between these internal electrode layers. Dimensional distortion caused by piezoelectric longitudinal-effects lengthen the actuator portion 46a in the vertical direction of FIG. 4, thereby reducing the volume in the ink channel 32a. An increase in pressure accompanying this volume change ejects ink in the ink channel 32a from the orifice 37a as a droplet 39. Following this, the switch 62a is opened and the application of voltage is cut off, returning the actuator portion to its original form. As the ink channel 32a increases in volume, ink is refilled into the ink channel 32a from the ink supply device 16 via a separate valve (not shown). To give a further example, if another switch 62b is closed, displacement of the actuator portion 46b will occur so that ink will be ejected from the ink channel 32b. Because the piezoelectric ceramic layers 40 are polarized in the direction in which they are stacked, a large amount of deformation develops in the stacked direction, resulting in highly effective ink ejection.

Next will be described in greater detail deformation undergone by the layered-type piezoelectric element 38 in the stacked direction 31 when a voltage is applied thereto. When a voltage of 25 V is applied to, for example, actuator portion 46a, then the overlapping region 46a₁ undergoes a significant displacement of 200 nm or more. On the other hand, the piezoelectric inactive section 48 hardly undergoes displacement at all. Further, displacement at the overlapping region 46a₁ pulls the non-overlapping regions 46a₂, creating some displacement there also. Because the ink channels 32a, 32b, and 32c are formed longer in the lengthwise direction than the actuator portions 46a, 46b, and 46c, the actuator portion 46a can efficiently deform into the corresponding ink channel 32a. Consequently, the droplet 39 can be effectively ejected using a low driving voltage of only 30 V.

As described above, according to the present embodiment, in the method of manufacturing the layered piezoelectric element 38 constructed from alternately stacked piezoelectric ceramic layers 40 and internal electrode layers 42, 44 and having a plurality of fine actuator portions 46, wherein the layered piezoelectric element 38 deforming the actuator portions 46 in the direction in which they are stacked, slit-shaped holes 52 are formed using ultrasonic wave abrasive particle machining after sintering the stacked body of green sheets 50, 51. The holes 52 are formed as through holes in the layered piezoelectric element 38. The actuator portions 46 are formed so as to be connected by nonthrough-hole portions 48 at both ends.

In the piezoelectric-type ink jet print head 15 of the present embodiment, a single layered-type piezoelectric element 38 serves as piezoelectric actuators for all the three ejection devices 70a, 70b, and 70c. Therefore, a plurality of arrays 30 assembled together can provide an ink jet print head 15 with a simple configuration that can be produced using simple methods. Therefore, the number and complexity of manufacturing processes can be reduced so that production costs can be reduced. In addition, because the piezoelectric actuators are layered-type piezoelectric elements 38 and because the ink channels 32a, 32b, and 32c are formed longer in the lengthwise direction than corresponding actuator portions 46a, 46b, and 46c, consequently, the actuator portions 46a, 46b, and 46c can effectively and easily deform into corresponding ink channels 32a, 32b, and 32c so that driving voltage can be significantly reduced.

Further, because the internal electrode layers 42, 44 of the layered-type piezoelectric element 38 are formed by screen printing, the electrodes can be easily formed even when the actuator portions 46a, 46b, and 46c and the elongated holes 52 are formed extremely thin. Therefore, an array 30 including the ejection devices 70a, 70b, and 70c can be formed to a small size so that a print head that allows high resolution and a wide printing range can be achieved.

Further, each of the actuator portions 46a, 46b, and 46c divided by the elongated holes 52 are supported connected together at their both end portions by the piezoelectric nonactive region 48. Consequently, even when the actuator portions 46a, 46b, and 46c are formed to a narrow width, they will not break or be damaged during production of the print head. Therefore, yield when producing the print head is improved. The actuator portions 46a, 46b, and 46c will also not break when driven, thereby improving reliability of the resultant print head. Also, if the actuator portions 46a, 46b, and 46c can be formed thinner, they can be formed into a more highly integrated unit, which improves print quality of the resultant ink jet print head.

Still further, only the electrode terminal portions 43, 45 of the internal negative electrode layers 42 and internal positive electrode layers 44 are exposed to the exterior. Therefore, deterioration of insulating properties, such as deterioration caused by silver migration, is eliminated. Advantages such as superior durability and moisture resistance are gained. Also, because the outer negative electrodes 53 and the outer positive electrodes 54a, 54b, and 54c connected to the internal electrode layers 42, 44a, 44b, and 44c are formed on the same side surface of the layered-type piezoelectric element 38, the electrodes can be easily picked up and collectively electrically connected to the drive control circuit controlling drive of the print head. Also, the outer negative electrodes 53 and the outer positive electrodes 54a, 54b, and 54c can be connected to the electric circuit at a single side surface of the array 30 so that less space is taken up.

While the invention has been described in detail with reference to a specific embodiment thereof, it would be apparent to those skilled in the art that various changes and modifications may be made therein without departing from the spirit of the invention, the scope of which is defined by the attached claims.

Figure 10:
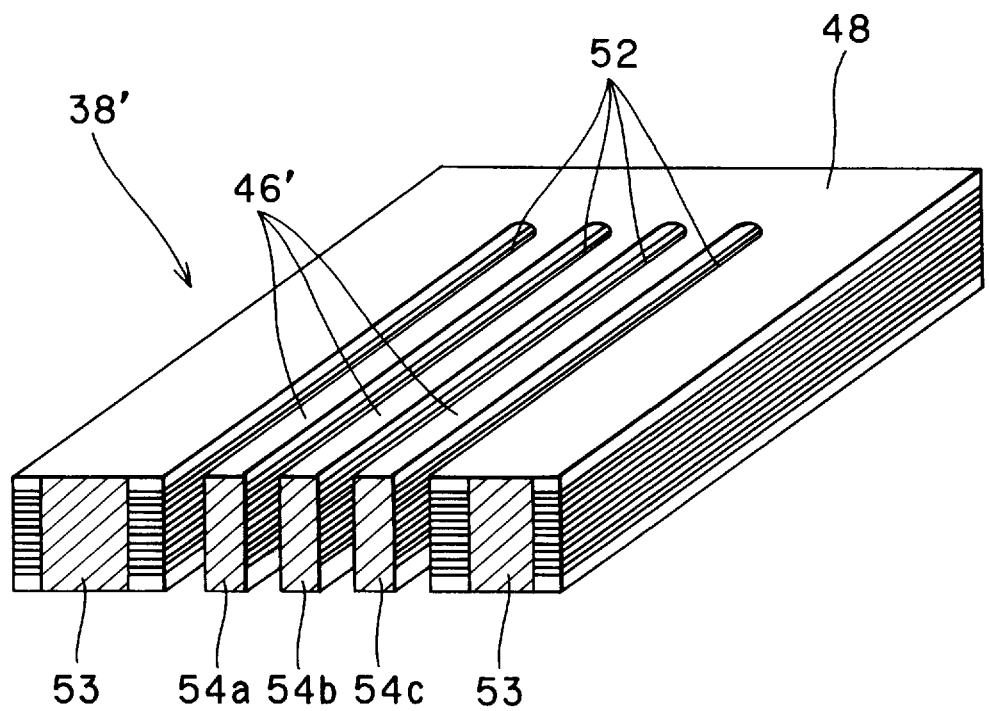
FIG. 10 is a perspective view of a modification of the layered piezoelectric element.

For example, in the above-described embodiment, the plurality of actuator portions 46 formed in the layered piezoelectric element 38 are connected to each other by the piezoelectric inactive portions 48 at both ends. However, as shown in FIG. 10, a layered piezoelectric element 38' can be formed with one end opened and the other end connected by a single inactive portion 48. Because actuator portions 46' of the layered piezoelectric element 38' are connected and supported at one end, there is no danger of the actuators 46' snapping during manufacture or drive even when formed with a narrow width. Also, because one side is left open, the actuator portions 46' will not be restricted when driven to deform so that a large deformation can be achieved.

Also, in the above-described embodiment, the holes 52 dividing the layered piezoelectric element 38 into the actuator portions 46 are through holes that pass completely through the piezoelectric element 38. However, indentations that do not pass through the layered piezoelectric element 38 can be used instead as long as crosstalk between adjacent actuator portions 46 does not become a problem. Also, the holes 52 need not be shaped into elongated slit shapes, but can be formed into a variety of other shapes.

In the above-described embodiment, the internal electrode layers 42, 44 are formed using various patterns that are insulated and separated in correspondence with the actuator portions 46. However, this need not be the case. For example, during screen printing, not only the internal electrode layer 42 but also the internal electrode layer 44 can be formed into a single shape connecting all the actuator portions 46. Then when forming the hole portions 52 using ultrasonic abrasive particle machining, the internal positive electrode layers 44 may be divided into three electrode layers 44a through 44c, connected with the three electrode layers 45a through 45c, to thereby form the mutually-insulated actuator portions 46.

Although, in the above-described embodiment, one layered-type piezoelectric element 38 serves as piezoelectric actuators for the three ejection devices 70a, 70b, and 70c. However, piezoelectric actuators for additional ejection devices can be formed by adding to, or changing the pattern of, the internal positive electrode layers 44.

Further, in the above embodiment, the internal positive electrode layers 44 are divided in a one-to-one correspondence to the ink channels 32a, 32b, and 32c. However, the internal positive electrode layers 44 can be formed as the common electrodes, and the internal negative electrode layers 42 may be divided to a one-to-one correspondence to the ink channels 32a, 32b, and 32c. Alternatively, both the internal positive electrode layers 44 and the internal negative electrode layers 42 may be separated in a one-to-one correspondence to the ink channels 32a, 32b, and 32c. That is, it is sufficient for at least one of the internal electrode layers, either positive or negative, to be divided in a one-to-one correspondence to the ink channels 32a, 32b, and 32c.

Also, the array 30 can be provided with more or less than the three ink channels described in the present embodiment.

In the embodiment, the print head 15 is comprised of a plurality of arrays 30. However, the print head 15 can be produced from a single array 30.

As described above, in the method of manufacturing a layered piezoelectric element according to the present invention, after forming a stacked body by pressing together alternately-stacked layers of piezoelectric material layers and conductive material electrode layers, holes are formed, using ultrasonic abrasive particle machining, in the stacked body to a depth in a direction in which the layers are stacked. The layered piezoelectric element is thus divided by the holes into a plurality of actuator portions. In this way, after forming the stacked body, holes are formed using ultrasonic abrasive particle machining. Therefore, the actuator portions can be formed with good dimensional precision and with smoothly machined surfaces.

The ultrasonic abrasive particle machining allows easily machining in free shapes by only changing the shape of the bit. As a result, actuators can be formed in any shape. Also, the number of processes relating to machining can be reduced by merely preparing a bit with a plurality blades for forming a plurality of holes simultaneously.

Further, the actuator portions will not be snapped apart during manufacture because the ultrasonic abrasive particle machining will not apply any great forces to the actuator portions.

The actuator portions are mutually supported at least one end so that the actuator portions are difficult to break during manufacture or drive even if formed to an narrow width. When the other end is open, deformation generated during drive will not be restricted so that a larger drive can be achieved. The actuator portions may be supported at both ends so that the actuator portions are difficult to break during manufacture or drive even if formed to an narrow width.

An ink jet head using this layered piezoelectric element will have good durability and good ejection characteristics in all ink ejection chambers.

As is clear from the above description, the method of manufacturing a layered piezoelectric element of the present invention is capable of providing an inexpensive, high-precision layered piezoelectric element with highly reliable strength. Particularly, because the piezoelectric element is divided into a plurality of actuator portions using ultrasonic abrasive particle machining, any great forces are not applied to the piezoelectric elements during machining processes. Therefore, there is no danger of snapping the actuator portions apart during manufacture, so that good yield can be achieved. Additionally, detailed and freely shaped machining can be performed. Smooth machined surfaces can be formed on the workpiece. Actuator portions can be formed in highly dense rows and with high precision. If the resultant layered piezoelectric element is used in an ink jet head, a highly compact head with high reliability and capable of high-quality printing can be provided.

We claim:

1. A method, of producing a layered piezoelectric element formed with at least two individually actuating portions, comprising the steps of:

forming a stacked body where at least one layer of a piezoelectric material and at least two electrode layers of a conductive material are stacked alternatively in a first direction; and forming at least one hole in the stacked body through an ultrasonic wave abrasive particle machining operation, each of the at least one hole extending at least in a part of the stacked body in the first direction so as to divide the stack body into at least two actuating portions which are individually deformable when electric fields are developed between corresponding areas of the at least two electrode layers.

2. A method as claimed in claim 1, wherein the hole forming process includes the steps of:

pressing a machining bit against the stacked body, the machining bit having at least one blade of a shape corresponding to a desired shape of the at least one hole; and vibrating the machining bit with an ultrasonic vibration while supplying the machining bit with a slurry in which abrasive particles are suspended in water.

3. A method as claimed in claim 2, wherein the number of the at least one blade is equal to the number of the at least one hole to be formed on the stacked body.

4. A method as claimed in claim 1, further comprising the step of connecting the stacked body to an ink chamber body having individual ink chambers, thereby preparing a multi-nozzle-type ink jet head, the individual actuator portions actuating to apply pressure fluctuations in the individual ink chambers to eject ink therefrom.

5. A method as claimed in claim 2, wherein the abrasive particles have particle diameter of equal to or lower than about 50 microns.

6. A method as claimed in claim 5, wherein the abrasive particles have particle diameter of about 10 microns.

7. A method as claimed in claim 2, wherein the machining bit is pressed against the stacked body with a pressure substantially in a range of 10 and 100 g/mm$^2$.

8. A method as claimed in claim 2, wherein the at least one hole is formed in the stacked body through subjecting the stacked body to the ultrasonic wave abrasive particle machining process with abrasive particles comprised of silicon carbide.

9. A method as claimed in claim 2, wherein the at least one hole is formed in the stacked body through subjecting the stacked body to the ultrasonic wave abrasive particle machining process with abrasive particles comprised of boron nitride.

10. A method as claimed in claim 2, wherein the at least one hole is formed in the stacked body through subjecting the stacked body to the ultrasonic wave abrasive particle machining process with abrasive particles comprised of alumina.

11. A method as claimed in claim 2, wherein the at least one hole is formed in the stacked body to extend through the stacked body in the first direction.

12. A method as claimed in claim 2, wherein the at least one hole is formed in the stacked body to extend at least in a part of the stacked body in a second direction orthogonal to the first direction.

13. A method as claimed in claim 2, wherein the stacked body forming step includes the steps of:

forming a plurality of first plate-shaped sheets each of which is made of piezoelectric material and formed with a first electrode layer;

forming a plurality of second plate-shaped sheets each of which is made of piezoelectric material and formed with a second electrode layer;

alternately positioning the first and second plate-shaped sheets in the first direction; and pressing together the alternately positioned plate-shaped sheets.

14. A method as claimed in claim 13, wherein each of the first and second plate-shaped sheets is formed through the steps of:

preparing a plate-shaped sheet from a piezoelectric material; and coating a conductive paste on the plate-shaped sheet through a screen printing process, to thereby form a corresponding electrode layer on the plate-shaped sheet.

15. A method as claimed in claim 14, wherein the second electrode layer is divided into at least two electrode portions electrically insulated from each other, each electrode portion being for developing electric field to the corresponding actuating portion.

16. A method as claimed in claim 13, wherein the stacked body forming step further includes the step of sintering the stacked body.

17. A method as claimed in claim 13, further comprising the steps of:

polarizing, in the first direction, the stacked body formed with the at least one hole; and connecting, to the stacked body, an ink channel body having at least two ink channels so that each ink channel is connected to a corresponding actuating portion.

18. A method of manufacturing a layered piezoelectric element having at least a pair of internal electrodes with at least a portion divided into a plurality of actuator portions deformable when selectively energized to develop electric fields between the electrodes, the method comprising the steps of:

forming a stacked body by pressing together alternately stacked piezoelectric layers of a piezoelectric material and electrode layers of a conductive material; and forming, using ultrasonic wave abrasive particle machining, holes in the stacked body to a depth in a direction in which the layers are stacked to divide the stacked body into actuator portions.

19. A method as claimed in claim 18, wherein the step of forming holes divides the stacked body into actuator portions that are opened at one end by the holes and that are mutually connected at another end, which is opposite the end, by a non-through-hole portion.

20. A method as claimed in claim 18, wherein the step of forming the holes divides the stacked body into actuator portions that are mutually connected at opposing ends by non-through-hole portions.

21. A method as claimed in claim 18, wherein the ultrasonic wave abrasive particle machining uses abrasive particles comprised of at least one of silicon carbide, boron nitride, and alumina.

22. A method as claimed in claim 18, wherein the step of forming a stacked body includes the steps of:

forming a first electrode layer on each of a plurality of first plate-shaped sheets made of piezoelectric material, each first electrode layer serving as a common electrode for energizing all of the actuator portions;

forming a plurality of second electrode layers on each of a plurality of second plate-shaped sheets made of piezoelectric material, each second electrode layer serving as a drive electrode corresponding to one of the actuator portions; and forming the stacked body by pressing together the first and second sheets which are alternately stacked one on the other.

23. A method as claimed in claim 22, wherein the steps of forming the first electrode layers and forming the plurality of second electrode layers are performed using screen printing with a conductive paste.

* * * * *